United States Patent [19]
Matsumoto

[11] Patent Number: 5,541,026
[45] Date of Patent: Jul. 30, 1996

[54] EXPOSURE APPARATUS AND PHOTO MASK

[75] Inventor: Koichi Matsumoto, Tokyo, Japan

[73] Assignee: Nikon Corporation, Tokyo, Japan

[21] Appl. No.: 480,360

[22] Filed: Jun. 7, 1995

Related U.S. Application Data

[63] Continuation of Ser. No. 897,670, Jun. 12, 1992, abandoned.

[30] Foreign Application Priority Data

| | | | |
|---|---|---|---|
| Jun. 13, 1991 | [JP] | Japan | 3-167381 |
| Jun. 13, 1991 | [JP] | Japan | 3-167382 |
| Jun. 13, 1991 | [JP] | Japan | 3-167383 |
| Nov. 7, 1991 | [JP] | Japan | 3-291465 |
| Nov. 7, 1991 | [JP] | Japan | 3-291466 |

[51] Int. Cl.$^6$ ..................................... G03F 9/00
[52] U.S. Cl. ................ 430/5; 430/321; 430/323; 430/322; 359/558
[58] Field of Search ..................... 430/5, 321, 323, 430/322; 350/162.11

[56] References Cited

U.S. PATENT DOCUMENTS 4,806,454  2/1989  Yoshida et al. .................. 430/321

FOREIGN PATENT DOCUMENTS 62-050811  10/1987  Japan .

Primary Examiner—S. Rosasco
Attorney, Agent, or Firm—Keck, Mahin & Cate

[57] ABSTRACT

In the lithographic operation for the manufacture of semiconductor devices, polarization of an exposure light is utilized as third information other than the amplitude and phase of the exposure light so as to obtain a high-resolution or high-contrast imaging performance. An exposure apparatus includes polarizing means arranged at the position of an incidence pupil of its projection optical system. Also, in a photo mask containing a pattern formed on a transparent substrate, a polarizing member is added to each of light transmitting portions in the pattern. With the diffracted beams from the photo mask contribution toward imaging, the directions of vibration of the electric vectors are arranged regularly to enhance interference performance and thereby to improve the contrast of an image. Also, the fundamental period of the pattern on the mask is substantially increased to improve the resolving power.

13 Claims, 5 Drawing Sheets

EXPOSURE APPARATUS AND PHOTO MASK

This is a continuation of application Ser. No. 07/897,670, filed Jun. 12, 1992, abandoned.

BACKGROUND OF THE INVENTION

1. Field of the Invention

The present invention relates to an exposure apparatus used for transferring the image of a circuit pattern formed in a photo mask onto a substrate (or wafer) during the lithographic operation in the manufacture of semiconductor devices and a photo mask (or a reticle) used as a transferring negative used in the course of such operation.

2. Description of the Prior Art

Conventional exposure apparatus generally used during the lithographic operation in the manufacture of semiconductor devices is constructed for example as schematically shown in FIG. 8 of the accompanying drawings.

In the Figure, a photo mask 21 is held horizontally by a mask stage 25 so as to be perpendicular to the optical axis of an illumination optical system 24 and it is illuminated by the transmission of an exposure light of a given wavelength radiated from the illumination optical system 24. The photo mask 21, which has heretofore been used for general purposes, is so constructed that a light shielding pattern made of such metal as chromium is formed on a transparent substrate and the diffracted beams corresponding to the pattern configuration are produced as the result of the illumination by transmission. The diffracted beams are condensed on an imaging plane 23 by a projection optical system 22 so that an image of the pattern contained in the photo mask 21 is transferred onto the surface of a wafer held to conform with the imaging plane 23 by a wafer stage 26. At this time, the beams condensed on the imaging plane 23 represents a condition having no polarization characteristic, i.e., the average condition of a TE polarized light and a TM polarized light which will be described latter.

Referring now to FIG. 9, there is schematically illustrated the cross-sectional construction of a conventional photo mask formed with a line-and-space pattern composed of alternately repeated light transmitting portions (substrate bear surface portions) 14 and light shielding portions 12. Also, FIG. 10a shows schematically the planar construction of the conventional photo mask, and FIG. 10b shows an amplitude-transmittance distribution of the conventional photo mask.

As shown in these Figures, the amplitude-transmittance is low (=0) in the light shielding portions 12 of the line-and-space pattern and it is high in the light transmitting portions 14, thereby forming a fundamental period $P_1$ of the pattern by the adjoining pair of the light shielding portion 12 and the light transmitting portion 14 as shown in FIG. 10b.

Even if the exposure is effected by use of the conventional photo mask of the type described above, however, there is the disadvantage of failing to meet the demand for finer circuit patterns due to the increase in the level of integration for semiconductor devices. Thus, there is the need for the development of a technique capable of forming a high-contrast image of a fine pattern.

Under these circumstances, as a means of enhancing the contrast of a pattern image, various phase shifting methods have recently been proposed in which projection exposure is effected by the use of a phase-shifted mask provided with phase shifting portions for varying the phase of transmitting beams at given locations of the light transmitting portions of the photo mask. For example, Japanese Patent Publication No. SHO 62-50811 discloses a technique relating to phase-shifted masks of a spatial frequency modulation type, etc. In accordance with the phase shifting method, a pattern image is formed by utilizing the phase information of light in addition to the amplitude information of light and therefore it is expected that some improvement of the imaging characteristic can be realized as compared with the method employing a photo mask composed of only light transmitting portions and light shielding portions.

Thus, the phase shifting method disclosed in the previously mentioned Japanese Patent Publication will now be described briefly with reference to FIGS. 11, 12a and 12b.

FIG. 11 shows schematically the cross-sectional construction of a conventional phase-shifted mask of the spatial frequency modulation type, FIG. 12a shows schematically its planar construction and FIG. 12b shows its amplitude-transmittance distribution. As will be seen from FIGS. 11 and 12a, in the line-and-space pattern the alternate light transmitting portions 14b are each provided with a phase shifter 15 so that the light beams transmitted through the light transmitting portions 14a and 14b adjoining each light shielding portion 12 on its sides have a phase difference of $\pi$ radians from each other. Also, as shown in FIG. 12b, the beam transmitted through the light transmitting portion 14b with the phase shifter 15 and the beam transmitted through the light transmitting portion 14a without the phase shifter 15 have amplitudes which are opposite in sign to each other and thus a fundamental period $P_2$ of the pattern is formed by the light transmitting portion 14a (without the phase shifter), the light shielding portion 12, the light transmitting portion 14b (with the phase shifter) and the light shielding portion 12.

However, while, in the case of phase-shifted masks of the type developed recently, the contrast of a pattern image is enhanced by adding the phase information of light to the amplitude information of light, these techniques are as a matter of course limited in imaging performance and are still inadequate in ensuring a satisfactory high-contrast image for any fine pattern.

Moreover, while it has been confirmed that the use of the phase-shifted mask of the above mentioned type has the effect of improving the imaging characteristic, the actual state is such that a sufficient resolving power capable of resolving the required fine pattern has not been obtained as yet.

SUMMARY OF THE INVENTION

It is the primary object of the present invention to provide an exposure apparatus and a photo mask used therewith which are capable of utilizing third information which is different from the amplitude and phase of light whereby a high-resolution or high-contrast imaging performance is realized and also a new development of the photolithographic technique is sought.

To accomplish the above object, in accordance with one aspect of the present invention there is thus provided an exposure apparatus for transferring the pattern contained in a photo mask onto a substrate, and the exposure apparatus includes illuminating means for illuminating the photo mask, a projection optical system for projecting the pattern on the photo mask onto the substrate, and polarizing means arranged at the position of the incident pupil of the projection optical system.

With the exposure apparatus according to the above aspect of the present invention, the polarizing means arranged at the pupil plane (incident pupil) of the projection optical system transmits only beams of electric vectors which vibrate in a predetermined direction so that an image of the pattern is formed on the substrate by the light beams whose directions of vibration of the electric vectors are arranged in the same direction and thus the interference between the diffracted beams is increased, thereby eventually obtaining the image which is high in contrast.

Also, in accordance with the present invention, even if the circuit pattern is made finer so that the diffraction angle of the light from the photo mask is increased, the contrast is maintained high and therefore the invention becomes more advantageous over the conventional exposure apparatus as the pattern becomes finer.

In accordance with another aspect of the present invention, there is provided an improved photo mask adapted for use with the exposure apparatus according to the first-mentioned aspect, and the photo mask includes a transparent substrate, a pattern to be transferred including light transmitting portions formed on the transparent substrate, and polarizing means formed on the light transmitting portions of the transparent substrate. The polarizing means transmits only such light beams whose electric vectors vibrate in a predetermined direction whereby the vibration directions of the electric vectors of the diffracted beams from the photo mask are arranged in the same direction and thus the interference between the diffracted beams is increased, thereby producing a high-contrast image. Further, even if the circuit pattern becomes finer so that the diffraction angle of the light from the photo mask is increased, the contrast is maintained high with the result that finer the circuit pattern is, more advantageous the photo mask becomes over the conventional photo masks.

Still further, with the photo mask according to the above-mentioned aspect of the present invention, it is possible to use at least two kinds of polarizing members adapted to convert the incident light into polarized light beams of different states of polarization from each other thereby increasing the fundamental period of the pattern of the photo mask. If the fundamental period of the pattern is increased, the diffraction angle of the diffracted beams produced from the photo mask is reduced so that when the exposure is effected by the use of the projection optical system (projection lens) having the same numerical aperture as previously, a resolving power far greater than previously can be obtained.

From the foregoing it will be seen that in accordance with the present invention the polarization of light is used as third information other than the amplitude and phase of light so that its combination with a phase-shifted mask presents no difficulty and it is possible to transfer an image of the mask pattern onto a substrate (wafer) with a higher contrast and a higher resolution.

Therefore, in accordance with the present invention, due to the use of the polarization of light as third information, not only there is the effect of attaining a higher contrast and a higher resolution but also there is the effect of forming a more excellent image through the combination of three information or the amplitude, phase and polarization information of light, and this is remarkably effective from the standpoint of contemplating a new development of the lithographic techniques.

The above and other objects, features and advantages of the present invention will become fully apparent from the following description of its preferred embodiments taken in conjunction with the accompanying drawings.

DESCRIPTION OF THE PREFERRED EMBODIMENTS

With a view to facilitating the understanding of the present invention, the principle of the presnt invention for ensuring a higher contrast will now be described first before proceeding with the description of preferred embodiments of the invention.

Figure 2A:
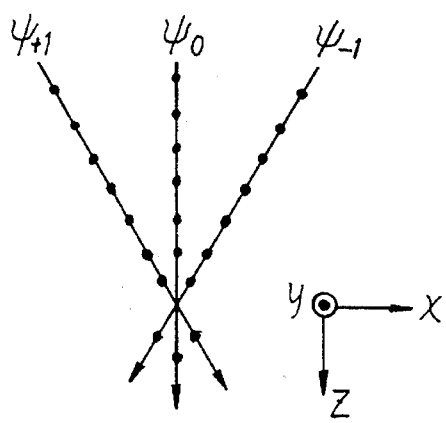
FIGS. 2a and 2b respectively show schematically the manners in which an image is formed by the TE polarization and TM polarization, respectively.
Figure 2B:
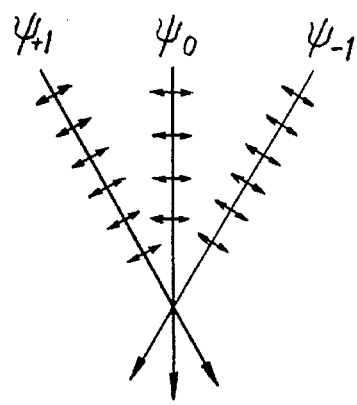

FIGS. 2a and 2b show schematically the manners of the diffracted beams in the vicinity of the imaging plane 23 in the ordinary conventional exposure apparatus explained in connection with FIG. 8. Firstly, FIG. 2a shows the so-called TE (transverse electric) polarized light condition and the direction of vibration of the electric vectors of the polarized light is perpendicular to the plane of incidence (the plane along the paper plane in this case). On the other hand, FIG. 2b shows the so-called TM (transverse magnetic) polarized light condition and the direction of vibration of the magnetic vectors of the polarized light is perpendicular to the plane of incidence or the direction of vibration of the electric vectors lies within the plane of incidence. While, in the case of the conventional exposure apparatus including no polarizing means in the projection optical system, the imaging is effected by the light of the average condition of the TE polarized light of FIG. 2a and the TM polarized light of FIG. 2b, the photochemical reaction of a light sensitive material such as a photoresist is progressed by the action of the electric field of light or electromagnetic radiation and thus the direction of vibration of the electric vectors presents a problem during the lithographic operation.

As will be seen from a comparison between FIGS. 2a and 2b, in the case of the TE polarization, the directions of vibration of the electric vectors of the respective diffracted light beams, e.g., the 0-order, ±first-order, --- beams are all arranged in directions perpendicular to the plane of the paper so that the interference effect between the diffracted beams becomes maximum and the contrast of an image is enhanced. In the case of the TM polarization, the directions of vibration of the electric vectors of the diffracted beams of different orders are each shifted by an amount corresponding to the angle made by the direction of travel of each diffracted beam so that the interference effect between the diffracted beams is decreased and it acts in a direction tending to decrease the contrast of the image.

Figure 8:
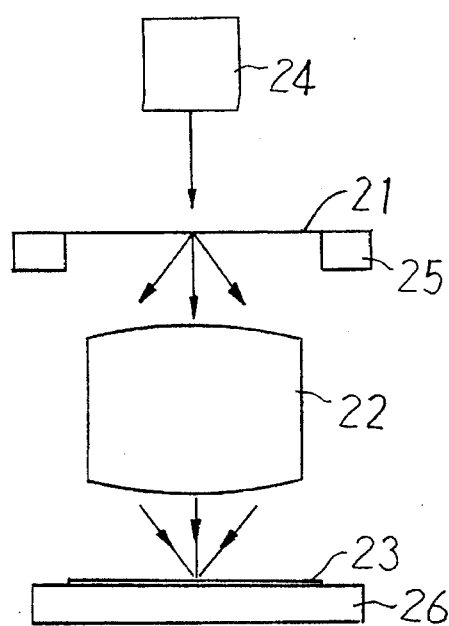
FIG. 8 is a schematic diagram showing the basic construction of a conventional exposure apparatus.
Figure 9:
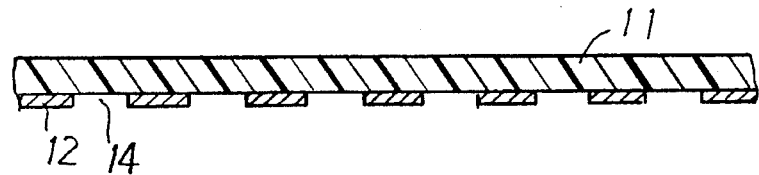
FIG. 9 is a schematic diagram showing the cross-sectional construction of the conventional photo mask.

Then, in order to further facilitate the understanding of the description, let us consider a specific example where in the case of FIG. 8, the photo mask 21 contains a line-and-space pattern (a pattern composed of alternately repeated light shielding portions and light transmitting portions of the same width) and an image of the pattern is formed by the 0-order diffracted beam and ±first-order diffracted beams of the diffracted beams from the photo mask 21. In this case, the amplitude of the 0-order diffracted beam is ½ of the incident light and the amplitude of the ±first-order diffracted beams is $1/\pi$.

Assuming that the respective coordinate axes x (the lateral direction in the plane of the paper), y (the vertical direction in the paper plane) and z (the perpendicular direction to the paper plane) are preset, that the direction cosine of the 0-order diffracted beam is set (0, 0, 1) and the direction cosine of the ±first-order diffracted beams is set (±α, 0, γ), and that the wave motions (vector quantities) of the 0-order diffracted beam and the ±first-order diffracted beams are respectively represented as $\psi_0$ and $\psi\pm_1$, as shown in FIGS. 2a and 2b, in the case of the TE polarization, the wave motions of the respective diffracted beams can be given by the following equations (1) to (3). In the equations, k is a constant ($=2\pi/\lambda$).

$$\psi_0 = \frac{1}{2} \begin{pmatrix} 0 \\ 1 \\ 0 \end{pmatrix} e^{ik(0x+0y+1z)} \quad (1)$$

$$\psi_{+1} = \frac{1}{\pi} \begin{pmatrix} 0 \\ 1 \\ 0 \end{pmatrix} e^{ik(\alpha x+0y+\gamma z)} \quad (2)$$

$$\psi_{-1} = \frac{1}{\pi} \begin{pmatrix} 0 \\ 1 \\ 0 \end{pmatrix} e^{ik(-\alpha x+0y+\gamma z)} \quad (3)$$

The composite wave field $\psi_{TE}$ of the wave motions $\psi_0$ and $\psi\pm_1$ of the 0-order diffracted beam and the ± first-order diffracted beams is given by the following equation (4) and the intensity distribution $I_{TE}(x, z)=|\psi|^2$ is given by the following equation (5).

$$\Psi_{TE} = \begin{pmatrix} 0 \\ 1 \\ 0 \end{pmatrix} \left( \frac{1}{2} e^{ikz} + \frac{1}{\pi} e^{ik\gamma z} \cdot (e^{ik\alpha x} + e^{-ik\alpha x}) \right) \quad (4)$$

$$I_{TE}(x,z) = \frac{1}{4} + \frac{2}{\pi} \cos(k\alpha x) \cdot \cos\{k(1-\gamma)z\} + \frac{4}{\pi^2} \cdot \cos^2(k\alpha x) \quad (5)$$

On the other hand, in the case of the TM polarization, the wave motions of the respective diffracted beams are given by the following equations (6) to (8).

$$\psi_0 = \frac{1}{2} \begin{pmatrix} 1 \\ 0 \\ 0 \end{pmatrix} e^{ikz} \quad (6)$$

$$\psi_{+1} = \frac{1}{\pi} \begin{pmatrix} \gamma \\ 0 \\ -\alpha \end{pmatrix} e^{ik(\alpha x+0y+\gamma z)} \quad (7)$$

$$\psi_{-1} = \frac{1}{\pi} \begin{pmatrix} \gamma \\ 0 \\ \alpha \end{pmatrix} e^{ik(-\alpha x+0y+\gamma z)} \quad (8)$$

The composite wave field $\psi_{TM}$ of the wave motions $\psi_0$ and $\psi\pm_1$, of the 0-order diffracted beam and the ±first-order diffracted beams is given by the following equation (9) and the intensity distribution $I_{TE}(x, z)=|\psi|^2$ is given by the following equation (10).

$$\Psi_{TM} = \begin{bmatrix} \frac{1}{2} e^{ikz} + \frac{1}{\pi} \gamma e^{ik\gamma z}(e^{ik\alpha x} + e^{-ik\alpha x}) \\ 0 \\ -\frac{1}{\pi} \alpha e^{ik\gamma z}(e^{ik\alpha x} - e^{-ik\alpha x}) \end{bmatrix} \quad (9)$$

$$I_{TM}(x,z) = \frac{1}{4} + \frac{2}{\pi} \gamma \cdot \cos(k\alpha x) \cdot \cos\{k(1-\gamma)z\} + \frac{4}{\pi^2} \{\alpha^2 + (\gamma^2 - \alpha^2) \cos^2(k\alpha x)\} \quad (10)$$

Let us now consider the log slope value as an image evaluation index. The log slope value represents a differentiated value when the intensity I at the boundary between the geometric light and dark portions is given in terms of a logarithmic value, that is, the value of $\partial \log I/\partial x$. Then, it is indicated that a so-called high-contrast image results as the magnitude of this value is greater. The log slope values in the cases of the TE polarization and the TM polarization can be computed from equations (5) and (10), respectively. Assuming that z=0 in terms of the best focusing plane for purposes of simplification, the log slope value $LS_{TE}$ for the TE polarization is given by the following equation (11) and the log slope value $LS_{TM}$ for the TM polarization is given by the following equation (12). Also, the log slope value in the case of a non-polarization condition represents the average condition of those obtained in the case of the TE polarization and the TM polarization.

$$LS_{TE} = \frac{4 \cdot \gamma}{\alpha} \quad (11)$$

$$LS_{TM} = \frac{4 \cdot \lambda}{\alpha} \cdot \frac{(1-\alpha^2)^{-2}}{1+16\alpha^2/\pi^2} \quad (12)$$

Considering the term which multiplies $4\lambda/\alpha$ in the right member of equation (12), it is known that the numerator is less than 1 and the denominator is greater than 1. From this it will be seen that the value of equation (12) on the whole is less than the value of equation (11).

This means that the imaging according to the TE polarization has a higher log slope value than in the case of the imaging according to the TM polarization. Also, since the value of α corresponds to the angle of diffraction, the advantage of the imaging according to the TE polarization is enhanced with a fine pattern of a greater angle of diffraction. Further, since the non-polarization condition is the average condition of those of the TE polarization and the TM polarization, the imaging according to the TE polarization has as a matter of fact a higher log slope value than in the case of the imaging according to the non-polarization and a so-called high-contrast image is obtained.

Thus, if polarizing means for converting the exposure light of the non-polarization condition (the average condition of the TE polarization and the TM polarization) to the TE polarization condition is arranged at the position of the pupil (incident pupil) of the projection optical system or at the photo mask, the imaging according to the TE polarization alone is made possible and the contrast of a fine pattern image can be improved remarkably. In this case, the polarization and phase of the light are independent information and therefore phase shifting members may be provided along with the polarizing means so as to utilize three information composed of the amplitude, phase and polarization of the light and thereby to obtain an image of the circuit pattern.

Figure 1A:
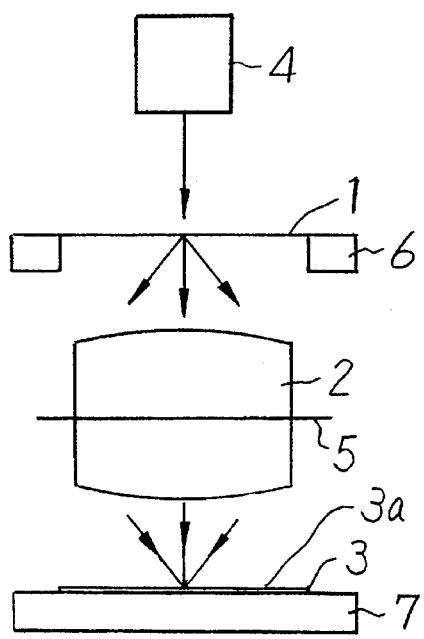
FIGS. 1a and 1b respectively show schematically a basic construction of an exposure apparatus according to a first embodiment of the present invention and a planar construction of the polarizing means arranged within its optical system.

FIG. 1a shows schematically a basic construction of an exposure apparatus according to a first embodiment of the present invention, and in the Figure an illumination optical system 4 includes a light source such as an extra-high pressure mercury vapor lamp or excimer laser to emit an exposure light of a wavelength capable of sensitizing a photoresist used in the lithographic operation.

A photo mask 1 is held within a horizontal plane by a mask stage 6 in such a manner that it is perpendicular to the optical axis of the illumination optical system. While there is no limitation to the configuration of a pattern formed on the photo mask 1, for purposes of making the description more specific, it is assumed that the photo mask 1 contains a so-called line-and-space pattern in which light transmitting portions and light shielding portions are alternately repeated and that the lines in the pattern extend in a direction perpendicular to the plane of the paper in FIG. 1a.

A projection optical system 2 is arranged below the photo mask 1 and its position in the optical axis direction is adjusted in such a manner that the focus of the projection optical system 2 on the side of the light source (the illumination optical system 4) practically coincides with the pattern containing surface of the photo mask 1. Polarizing means 5 is arranged at or near the pupil plane (the incident pupil plane) of the projection optical system 2 and the polarizing means 5 transmits only such light whose electric vectors vibrate in a direction tangential to a concentric circle centering the optical axis (pupil center) of the projection optical system 2 such as shown schematically in the form of a plane view in FIG. 1b.

Arranged below the projection optical system 2 is a wafer stage 7 on which a wafer 3 is carried and the position of the stage 7 along the optical axis is adjusted in such a manner that the imaging plane of the projection optical system 2 coincides with a wafer surface 3a. Also, the wafer stage 7 is movable within the horizontal plane and the relative positions of the wafer 3 and the photo mask 1 are adjusted by alignment means which is not shown prior to the exposure.

With the exposure apparatus constructed as described above, when the photo mask 1 is illuminated by the transmission of the exposure light from the illumination optical system 4, there are produced diffracted beams spreading in the lateral direction (the direction of arrangement of the pattern) within the paper plane in FIG. 1a from the photo mask 1 as shown in FIG. 1a. At this stage, the diffracted beams represent the average condition of the conditions according to the TE polarization and the TM polarization and there is substantially no deviation in the direction of vibration of their electric vectors.

Then, the diffracted beams enter the projection optical system 2 to reach the polarizing means 5 arranged at its pupil plane. At this time, of the diffracted beams from the photo mask 1, the 0-order diffracted beam falls on the pupil center of the projection optical system 2 (the center of the polarizing means 5) irrespective of the location of formation of the pattern, that is, irrespective of the pattern being positioned at the central portion or either end of the illuminated area, whereas the other diffracted beams, i.e., the ±first-order, ±second-order, ----, diffracted beams fall on those positions which are apart from one another by a given distance in the radial direction from the pupil center (the direction of arrangement of the pattern). Where the direction of arrangement of the pattern is a lateral direction within the paper plane in FIG. 1a, the positions of incidence to the polarizing means 5 of the diffracted beams of the various orders are arranged at given intervals along the diameter which laterally crosses the circles (FIG. 1b) centering the optical axis of the projection optical system 2 within the plane of the paper in FIG. 1b. Since the polarizing means 5 transmits only the light beams whose electric vectors vibrate tangentially to the circles centering the optical axis of the projection optical system 2 as mentioned previously, of the diffracted beams of the various orders, only those components whose electric vectors vibrate in the vertical direction in FIG. 1b are transmitted through the polarizing means 5.

Figure 1B:
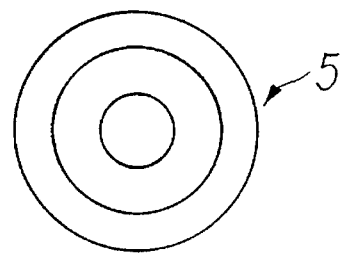

At this time, as shown in FIG. 1b, the polarization condition of the light beam transmitted through the center of the polarizing means 5 becomes unstable and therefore the incidence position of the 0-order diffracted beam should preferably be deviated from the center of the polarizing means 5. This can be easily realized by covering the central portion of the light source of the illumination optical system 4 to provide circular band illumination. In other words, when the circular band illumination is used, the photo mask 1 is illuminated from directions which are slightly inclined from the vertical direction (the optical axis direction) so that the 0-order diffracted beam is directed to a position radially shifted from the center of the polarizing means 5 by an amount corresponding to the inclination (at this time, the diffracted beams of the first and higher orders are also radially outwardly shifted successively in incident position) and therefore the light beams of the different vibration directions can be prevented from being transmitted through the polarizing means 5.

Referring again to FIG. 1a, the exposure light transmitted through the polarizing means 5 within the projection optical system 2 is converted to a TE polarized light whose direction of vibration of the electric vectors assume the same vertical direction to the plane of the paper in FIG. 1a (the line lengthwise direction of the pattern) and an image of the line-and-space pattern of the photo mask 1 is focused on the imaging plane 3a. As a result, the pattern image is transferred onto a given position of the wafer held at the imaging plane 3a.

In accordance with the present embodiment, an image is formed only by the beams of the uniform direction of vibration as mentioned above so that the interference effect between the diffracted beams is increased and a high-contrast transfer image is formed on the wafer surface.

Further, since the diffracted beams of the first and higher orders are increased in diffraction angle with decrease in the pitch of the pattern, while the contrast of the image is deteriorated by an amount corresponding to an increase in the shifting of the vibration direction of the TM polarized light in cases where the imaging is effected by the light of the non-polarized light condition (the average condition of the TE polarized light and the TM polarized light), where the imaging is effected by only the TE polarized light as in the case of the present embodiment, even if the diffraction angle is changed, the direction of vibration of the electric vectors is not changed and the imaging is effected while maintaining the high contrast. In other words, by using an exposure apparatus of the basic construction such as shown in FIG. 1a, even if the pitch of the pattern is decreased greatly, it is still possible to produce a high-contrast image and its advantage over the conventional exposure apparatus is more clearly manifested in the case of finer patterns.

It is to be noted that while, in the foregoing description, the pattern of the photo mask 1 is arranged laterally on the plane of the paper in FIG. 1a for purposes of facilitating the understanding, it is needless to say that even if the direction of arrangement of the pattern is any other direction, it is possible to obtain an image of the similarly high contrast in accordance with the present invention and the exposure apparatus of the present embodiment can meet the requirement of patterns of all the configurations. In other words, if the direction of arrangement of a pattern is not the same, the spreading direction of the diffracted beams is correspondingly changed, thereby changing the direction in which the incidence positions of the diffracted beams of the various orders are arranged in order in the pupil plane of the projection optical system 2. For instance, if the direction of arrangement of the pattern is the vertical direction within the paper plane in FIG. 1b, the incidence positions of the diffraction beams of the various orders are arranged along the diameter which vertically crosses the concentric circle of FIG. 1b within the paper plane. However, since the polarizing means 5 of the present embodiment is adapted to transmit only the light having a vibration plane in the tangential direction of the concentric circle of FIG. 1b, irrespective of the direction of arrangement of the pattern, only the light whose electric vectors vibrate in a direction parallel to the sides of the pattern is always transmitted through the polarizing means 5.

On the contrary, in a special case where the direction of arrangement of the pattern is limited to one direction, instead of using the polarizing means 5 (FIG. 1b) whereby the direction of vibration of light to be transmitted is changed depending on the circumferential position, it is suffice to use polarizing means adapted to transmit such light which vibrates in the same direction (the line lengthwise direction of the pattern) irrespective of the incidence position.

Next, the following shows by way of example the results of the log slope values of the pattern images obtained under the best focusing conditions according to the respective polarized light conditions (the TE polarized light, the TM polarized light and the average of the TE polarized light and the TM polarized light) from equations (11) to (13) with the exposure light wavelength $\lambda=365$ nm. From the results shown in the following Table 1 it will also be seen that the advantages of the present invention are more fully exhibited with increase in the fineness of patterns and it will be understood that the exposure apparatus of the present invention is extremely effective in the manufacture of semiconductor devices of high integration levels such as 64M-DRAMs.

TABLE 1

| Line width (L/S) | T E | T M | Average |
| --- | --- | --- | --- |
| 0.7 μm | 11.429 | 9.938 | 10.683 |
| 0.6 μm | 13.333 | 11.045 | 12.189 |
| 0.5 μm | 16.000 | 12.250 | 14.125 |
| 0.4 μm | 20.000 | 13.307 | 16.653 |
| 0.3 μm | 26.667 | 13.229 | 19.948 |

Then, while the foregoing description is directed to the case employing the photo mask formed with the pattern only by use of the light shielding films for purposes of simplification, the exposure apparatus of the present invention can be used in combination with a phase-shifted mask. As regards the phase-shifted mask, there have been proposed phase-shifted masks of various types including among others a spatial frequency modulation type in which a phase shifter is added to one of each pair of light transmitting portions adjoining through a light shielding portion (e.g., the method disclosed in Japanese Patent Publication No. 62-50811), a multiple-stage type employing phase shifters of different thicknesses, an auxiliary pattern type employing an auxiliary pattern composed of phase shifters on the peripheral edge of a light shielding pattern, an edge emphasizing type in which a phase shifter is provided at every boundary between a light shielding portion and a light transmitting portion and a chromium-less type in which a pattern is formed by only phase shifters, and the present invention can be combined with the phase-shifted mask of any type.

Also, while the foregoing description is directed to the case where the transmission-type photo mask is used, the present invention can be applied to a case employing a photo mask of a reflection type in which reflecting members (reflecting films) are provided on a transparent substrate. With the reflection-type photo mask, the photo mask is subjected to falling radiation illumination and the reflected beams from the reflecting films are condensed by an imaging optical system to form an image whose dark and light portions respectively correspond to light transmitting portions and reflecting portions. Thus, by arranging at the pupil plane of an imaging optical system any polarizing means which transmits light beams whose electric vectors vibrate in the direction parallel to the sides of the pattern, the contrast of the image can be enhanced as in the case of employing the transmission-type photo mask.

While the foregoing description shows an example of the exposure apparatus based on the basic principle of the present invention for improving the contrast of an image, a second embodiment relating to the photo mask based on the above-mentioned basic principle will now be described.

Figure 3:
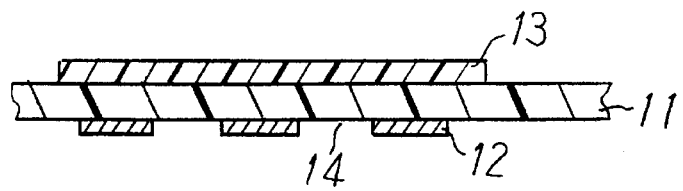
FIG. 3 is a schematic diagram showing the cross-sectional construction of a photo mask according to a second embodiment of the present invention.

FIG. 3 shows schematically a cross-sectional construction of a photo mask according to the second embodiment of the present invention. In the Figure, a plurality of light shielding films 12 made of chromium or the like are arranged at a given pitch on the lower surface of a transparent substrate 11 made of quartz or the like. In the present embodiment, the light shielding films 12 are each formed in a direction vertical to the plane of the paper in FIG. 3 with a sufficient length (as compared with the lateral pitch within the paper plane), thereby forming the so-called line-and-space pattern in which the light transmitting portions and the light shielding portions are alternately repeated. Also, polarizing films 13, which transmit only light beams having vibration planes of the electric vectors in a direction parallel to the sides of the light shielding films 12 (namely, the vertical direction to the plane of the paper), are formed on the upper surface of the transparent substrate 11 so as to cover the area corresponding to the line-and-space pattern on the whole. While, in the case of FIG. 3, the polarizing films 13 are applied to the upper side of the transparent substrate 11, it can also be applied to the lower side (the side formed with the light shielding pattern).

Next, a description will be made of the imaging effected by using the photo mask of FIG. 3 in the conventional exposure apparatus explained in connection with FIG. 8. When the exposure light from the illumination optical system 24 is transmitted through the photo mask 1 thereby illuminating it first, the exposure light is diffracted by the line-and-space pattern extended in the vertical direction to the plane of the paper and the diffracted beams are spread in the directions along the plane of the paper. At this time, since the polarizing films 13 for transmitting only the light whose electric vectors vibrate in the vertical direction to the plane of the paper are formed on the upper surface of the transparent substrate of the photo mask 21 in FIG. 3, only the diffracted beams of the TE polarized light are emitted from the photo mask 21. The diffracted beams from the photo mask 21 are condensed by the projection optical system 22 so that an image of the line-and-space pattern of FIG. 3 is focused on the imaging plane 23 and the circuit pattern is transferred onto the surface of a wafer (not shown) which is held horizontally on the imaging plane 23.

In accordance with the present embodiment, only the light beams whose electric vectors vibrate in the direction parallel to the sides of the lines in the pattern are used to effect the imaging so that as in the case with the principle mentioned previously, the interfernce effect between the diffracted beams is enhanced and an image having a high contrast between the light and dark portions is produced. Also, since the diffraction angle of the diffracted beams of the first and higher orders is increased as the pattern pitch is decreased, where the imaging is effected with light of the non-polarized condition (TE polarized light+TM polarized light) as in the past, the contrast of the image is deteriorated correspondingly as the direction of vibration of the TM is deviated increasingly. On the contrary, where the imaging is effected by the TE polarized light alone as in the case of the present embodiment, even if the angle of diffraction is changed, the direction of vibration of the electric vectors is not changed and therefore the high contrast of an image is maintained. In other words, by using a photo mask of such construction as shown in FIG. 3, it is possible to obtain an image of a high contrast even if the pitch of the line-and-space pattern is decreased considerably and its advantage over the conventional photo masks becomes more clear as the fineness of a pattern is increased.

As an example, the previously mentioned Table 1 shows the results of the log slope values of the pattern images obtained under the best focusing (in other words, z=0 in equations (11) to (13)) condition which is attained in the respective polarized light conditions (the TE polarized light, the TM polarized light, and the average of the TE polarized light and the TM polarized light) from equations (11) to (13) with the exposure light wavelength $\lambda$=365 nm. From the results of the Table 1 it is also apparent that the advantage of the present invention is fully exhibited as the fineness of a pattern is increased and it will be seen that the photo mask according to the present invention is extremely effective in the manufacture of semiconductor devices which are high in the level of integration, e.g., 64M-DRAMs.

Then, while, the foregoing description is directed to the case in which the polarizing means (the polarizing films 13) is added to the photo mask composed of the light shielding films alone for purpose of simplifying the description, the present invention makes it possible to construct so that polarizing means is formed on the light transmitting portions of a phase-shifted mask. As regards the phase-shifted mask, there have been proposed various types of phase-shifted masks including among others a spatial frequency modulation type in which a phase shifter is added to one of each pair of light transmitting portions adjoining each other through a light shielding portion (e.g., the photo mask disclosed in Japanese Patent Publication No. 62-50811) as well as a multiple-stage type in which phase shifters of different thicknesses are provided, an auxiliary pattern type in which an auxiliary pattern composed of phase shifters is provided along the peripheral edge of a light shielding pattern, and an edge enhancement type in which a phase shifter is arranged at each boundary between a light shielding portion and a light transmitting portion, and the present invention can be applied to the phase-shifted mask of any type so that depending on the circuit pattern, polarizing means may be added only to a part of a phase-shifted mask or alternatively both a phase shifter and a polarizing member may be formed at each same location. In addition, it is not always necessary to provide a light shielding portion at each of the portions corresponding to the dark portions of a pattern image to be transferred and the pattern may be formed with the phase shifters alone. For instance, it is also possible to arrange the phase shifters in a checkered flag form to obtain the dark portions without using any light shielding films.

Further, as regards the configuration of a pattern, it is needless to say that the configuration is not limited to a line-and-space pattern such as shown in FIG. 3, and an isolated pattern such as a hole pattern may be used. For instance, where polarizing members are added to the hole pattern portion of substantially square shape, it is only necessary to provide a polarizing mamber which transmits only such beam that the electric vectors vibrate in a direction parallel to the side of the square at each side of the square.

It is to be noted that while the second embodiment has been described with reference to the transmission-type photo mask, even in the case of a reflection-type mask in which reflecting members (reflecting films) are provided on a transparent substrate, polarizing members can be selectively added to the reflecting portions to enhance the contrast of an image as in the case of the transmission-type photo mask. The reflection-type photo mask is such that the photo mask is subjected to falling radiation illumination and the reflected light from the reflecting films is condensed by the imaging optical system to form an image, and that the light transmitting portions correspond to the dark portions of the image and the reflecting portions correspond to the light portions of the image. Therefore, it is only necessary to consider the previously mentioned transmission-type photo mask in which the light transmitting portions are replaced with the reflecting portions and the light shielding portions are replaced with the light transmitting portions, and it is suffice to provide the reflecting portions with polarizing members which transmit only such light that the electric vectors vibrate in a direction which is parallel to the boundary between the light transmitting portions and the reflecting portions (the sides of the pattern).

While the preferred embodiments of the exposure apparatus and the photo mask capable of improving the contrast of an image by use of a polarized light have been described so far, the fact that the resolution can be improved by use of a polarized light will now be described.

Firstly, the principle of the present invention for realizing a high resolution will now be described to further promote the understanding of the present invention.

In the exposure apparatus of the type used generally, a photo mask is illuminated by transmission so that the diffracted beams corresponding to the pattern contained in the photo mask are produced from the photo mask and the produced diffracted beams are condensed on the image plane by the projection optical system, thereby forming an image of the pattern. At this time, higher the orders of the diffracted beams introduced into the projection optical system are, greater will be the fidelity of the resulting image to the original pattern. As a result, if the angle of diffraction is decreased, the resolution of a pattern is possible with an exposure apparatus which is low in numerical aperture (NA). In other words, where the exposure apparatus of the same numerical aperture (NA) is used, the use of a photo mask capable of reducing the diffraction angle permits the resolution of a finer pattern.

Then, as is well known in the field of wave optics, if P represents the fundamental period of a pattern, the diffracted beam produced from the photo mask is emitted in the direction of a diffraction angle θ which satisfies the following equation $$P \cdot \sin\theta = n\lambda (n=0, \pm1, \pm2, \ldots) \quad (13)$$

Here, λ represents the wavelength and n represents the order of the diffracted beam.

Figure 12A:
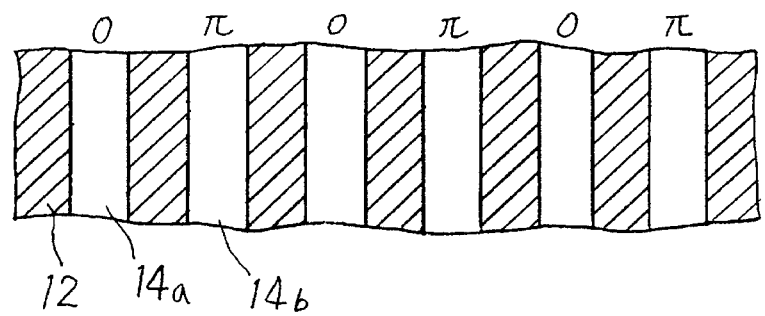
FIGS. 12a and 12b are schematic diagrams respectively showing the manner of arrangement of the pattern in the conventional phase-shifted mask as looked from just above and an amplitude-transmittance distribution of this phase-shifted mask.
Figure 12B:
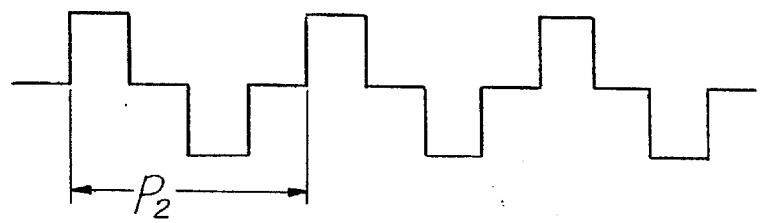

As will easily be seen from equation (13), the diffraction angle θ is decreased as the period P is increased. A comparison between the previously explained FIGS. 10 and 12 shows that the fundamental period $P_2$ of the line-and-space pattern in the phase-shifted mask (FIG. 12) is two times the magnitude of the fundamental period $P_1$ of the conventional photo mask (FIG. 10) without the addition of phase shifting members. As a result, the diffracted beams produced from the phase-shifted mask of FIG. 12 are decreased in diffraction angle as compared with the photo mask of FIG. 10 so that the diffracted beams including those of higher orders are introduced into the projection optical system. This fact constitutes one of the main reasons for the imaging performance being improved by the use of the phase-shifted mask.

In this case, while the diffracted beams of greater diffraction angles can be introduced if the numerical aperture of the exposure apparatus is extremely large, the numerical aperture of the exposure apparatus cannot be increased indefinitely so that it is preset in consideration of the overall imaging performance including the focal depth of an image to be obtained and so on and there is a limitation to increasing the limit of resolution on the part of the exposure apparatus. If the fineness of patterns is advanced so that the period P becomes less than a given value, even the ± first-order diffracted beams cannot reach the imaging plane and the resolution is no longer possible.

Therefore, in accordance with the present invention, use is made of a specific quality which has not heretofore been utilized, i.e., the polarization of light so as to expand the period P of a pattern and thereby to improve the resolving power.

The principle of the present invention will now be described in greater detail by taking the case in which the invention is applied to the line-and-space pattern of FIG. 10 (reference is to be had to FIGS. 4 and 5).

Figure 5A:
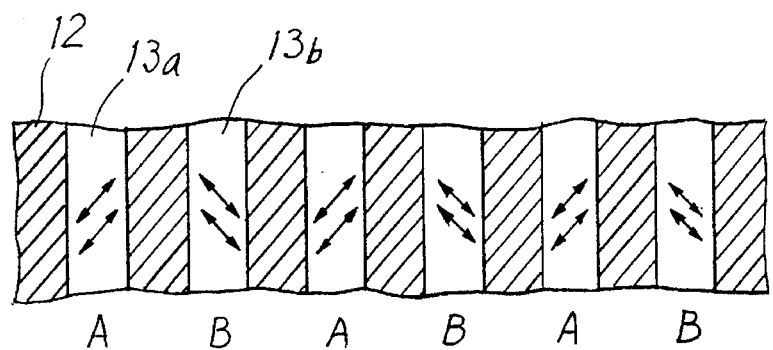
FIGS. 5a and 5b are schematic diagrams respectively showing the manner of arrangement of the pattern in the photo mask of the third embodiment as looked from just above and an amplitude-transmittance distribution of the photo mask.

In FIG. 5a, light transmitting portions 13a and 13b adjoining each other through a light shielding portion 12 are respectively provided with polarizing members for transmitting light beams which vibrate in directions perpendicular to each other. In the Figure, the arrows show the directions of vibration of the light beams which can be transmitted through the light transmitting portions 13a and 13b and here the two polarized light conditions perpendicular to each other are respectively referred to as A and B.

Generally, light can be represented in terms of the sum of two different polarized light conditions perpendicular to each other and therefore the polarized beams A and B will be considered independently of each other. Noting first the polarized beam A, the polarized beam A can pass as such through the light transmitting portion 13a but cannot be transmitted through the light transmitting portion 13b and thus the light transmitting portion 13b serves as a light blocking portion for the polarized beam A. As a result, when observed by the polarized beam A, the amplitude transmittance of the pattern of FIG. 5a becomes the condition represented by the waveform A of FIG. 5b and the transmittance is high only in the alternate light transmitting portions 13a.

Similarly, considering the case by noting the polarized beam B, the polarized beam B can pass through the light transmitting portion 13b but cannot be transmitted through the light transmitting portion 13a and the light transmitting portion 13a serves as a light blocking portion for the polarized beam B. In other words, the light transmitting portions which transmit the polarized beam B become reverse to the case of the polarized beam A and the amplitude transmittance of the pattern observed by the polarized beam B becomes the condition represented by the waveform B in FIG. 5b.

From these facts it will be seen that in the case of FIG. 5a where the two intersecting polarized beams A and B pass through the photo mask while being separated from each other, the fundamental period P of the pattern is established by the light transmitting portion 13b (the light blocking portion for the polarized beam A), the light shielding portion 12, the light transmitting portion 13b (the light blocking section for the polarized beam B) and the light shielding portion 12, and thus the fundamental period P of the pattern becomes two times in magnitude as compared with the case in which the light of the average condition of the polarized beams A and B is transmitted through the conventional photo mask (in the previously mentioned case of FIG. 10). This indicates that even if the exposure apparatus of the same numerical aperture is used, a higher resolution can be obtained by the use of the photo mask of FIG. 5a which is additionally provided with the polarizing members for transmitting the two intersecting polarized beams A and B.

When considered in this way, it will be seen that in accordance with the present invention it is only necessary from the principle point of view to provide at least two kinds of polarizing members in the light transmitting portions of the transparent substrate so as to convert the illuminating light to the respective polarized light conditions which are perpendicular to each other and deliver them as such.

More specifically, such at least two kinds of polarizing members are those which produce the polarized beams mentioned in the following (1) to (3), and in any case of (1) to (3) the associated polarized beams produced are in the polarized beam conditions which are perpendicular to each other:

1. Two linearly-polarized beams whose directions of vibration are perpendicular to each other (in this specification the term direction of vibration is the direction of vibration of the electric vectors unless otherwise specified).

2. A circularly-polarized beam of the clockwise rotation and a circularly-polarized beam of the counterclockwise rotation.

3. Two elliptically-polarized beams whose directions of major axes are perpendicular to each other but are opposite in the direction of rotation.

Also, the principle of the present invention can be applied to the phase-shifted mask so that the period of a pattern can be increased further by adding the combination of the polarizing members and the phase shifters to the light shielding portions (the details will be described later).

A photo mask according to a third embodiment based on the previously mentioned principle of improving the resolving power will now be described with reference to FIGS. 4 and 5.

Figure 4:
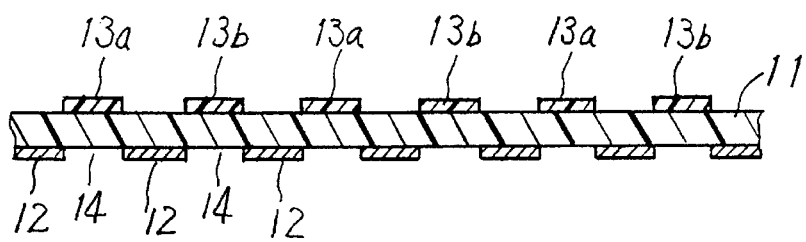
FIG. 4 is a schematic diagram showing the cross-sectional construction of a photo mask according to a third embodiment of the present invention.
Figure 5B:
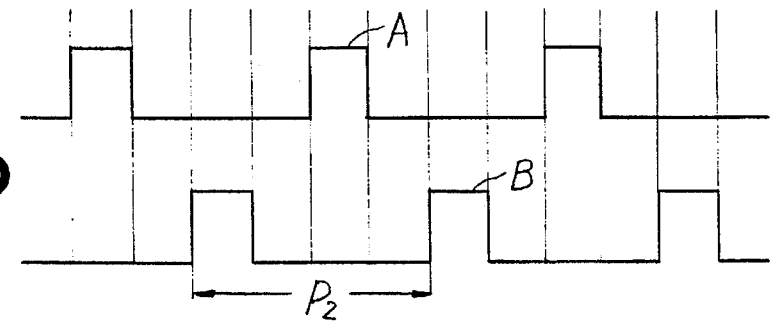

FIG. 4 shows schematically the cross-sectional construction of the photo mask according to the third embodiment, FIG. 5a shows schematically the planar construction of the photo mask according to the third embodiment and also FIG. 5b shows a transmittance distribution of the photo mask according to the third embodiment.

As shown in FIGS. 4 and 5, a plurality of light shielding portions 12 made of chromium or the like are arranged at a given pitch $P_2$ on a substrate 11 which is transparent to an exposure light and here a line-and-space pattern of a pitch $P_2$ is formed. Disposed on light transmitting portions 14 between the light shielding portions 12 are two kinds of polarizing members 13a and 13b which are alternately arranged in the direction of pattern arrangement so as to respectively transmit two kinds of lineraly-polarized beams A and B whose directions of vibration are perpendicular to each other and also the directions of vibration are inclined at an angle of 45 degrees relative to the sides of the lines in the pattern (the reason for this will be described further on). While the polarizing members 13a and 13b are provided on the substrate surface on the opposite side to the light shielding pattern as shown in FIG. 4, they may be formed on the side of the surface containing the light shielding pattern.

In this photo mask, the light transmitting portions provided with the polarizing members 13b serve as light blocking portions for the polarized light A and the light transmitting portions provided with the polarizing members 13a serve as light blocking portions for the polarized beam B. Thus, the amplitude-transmittances of the polarized beams A and B become as shown in FIG. 5b. In other words, in accordance with the present embodiment the fundamental period $P_2$ of the pattern become two times that of the case without the addition of any polarizing members as previously mentioned in connection with the principle and the diffraction angle of the transmitted beams is decreased correspondingly. As a result, even if the same exposure apparatus is used, the resolving power is improved as compared with the conventional photo mask.

Then, a description will now be made of the reasons for selecting the directions of vibration of the polarizing members A and B to be directions inclined at an angle of 45 degrees relative to the sides of the pattern.

The linearly-polarized light include the TE (transverse electric) polarized light condition whose direction of vibration of the electric vectors is vertical to the incident plane and the TM (transverse magnetic) polarized light condition whose direction of vibration of the magnetic vectors is vertical to the incident plane or the direction of vibration of the electric vectors lies within the incident plane, and the light incident on the photo mask is in the average condition of the TE polarized light and the TM polarized light. Assuming that the polarizing members 13a provided on the light transmitting portions are each designed to transmit only the TE polarized beam (whose electric vectors vibrate in a direction parallel to the lines of the pattern and the polarizing members 13b provided on the other light transmitting portions are each designed to transmit only the TM polarized beam (whose electric vectors vibrate in the direction of arrangement of the pattern in FIG. 5a), the following problems will be caused.

In other words, when the photo mask is illuminated by transmission, diffracted beams of various orders are produced from the photo mask so that the beams of the different diffraction orders reach the imaging plane through different paths within the incident plane, in the case of the TE polarized beams, the directions of vibration of their electric vectors are always directed in the same vertical direction to the incident plane despite of their being different in diffraction angle and the interference effect between the diffracted beams becomes maximum. On the other hand, in the case of the TM polarized beams, the directions of vibration of the electric vectors of the diffracted beams of the different orders deviate from one another and the interference effect between the diffracted beams is deteriorated.

Thus, at the imaging plane, the light intensity is increased in the portions corresponding to the light transmitting portions provided with the polarizing members 13a for transmitting the TE polarized beams, whereas the light intensity is decreased in the portions corresponding to the light transmitting portions provided with the polarizing members 13b for transmitting the TM polarized beams, and the light portions differ in brightness within the pattern composed of the series of lines and spaces. Thus, in accordance with the present embodiment, in order to avoid the occurrence of such difference in brightness, the directions of vibration of the beams transmitted by the polarizing members are respectively inclined in the opposite directions at an angle of 45 degrees so that the light intensity which is intermediary between the case of the TE polarizing light and the case of the TM polarizing light is obtained in the light portions of the pattern image.

In this connection, it is needless to say that where the light intensity need not to be uniform in the light portions of the pattern image, there is no particular limitation to the vibration directions themselves provided that the directions of vibration of the polarized beams A and B are perpendicular to each other.

Also, while, in the case of FIG. 5a, only the two kinds of polarizing members are used to provide the intersecting polarized beams A and B, there is no inconvenience even if three or more kinds of polarizing members are used in the photo mask of the present invention. Not only suitable polarizing members for the respective patterns may of course be used at any location where for example the directions of arrangement of the patterns are changed but also three or more polarizing members may be used within a series of patterns.

Next, a photo mask of a fourth embodiment composed of a combination of the photo mask of the previously mentioned third embodiment as a basis and phase shifters will now be described with reference to FIGS. 6 and 7.

Figure 6:
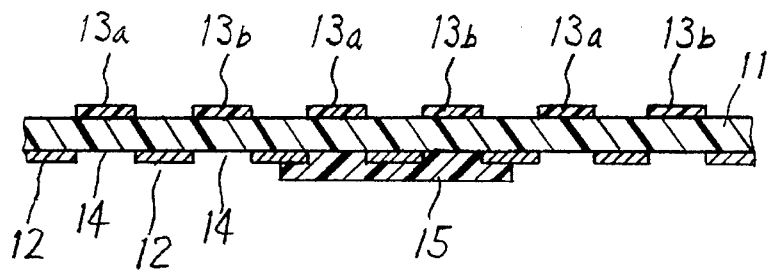
FIG. 6 is a schematic diagram showing the cross-sectional construction of a photo mask according to a fourth embodiment of the present invention.
Figure 7A:
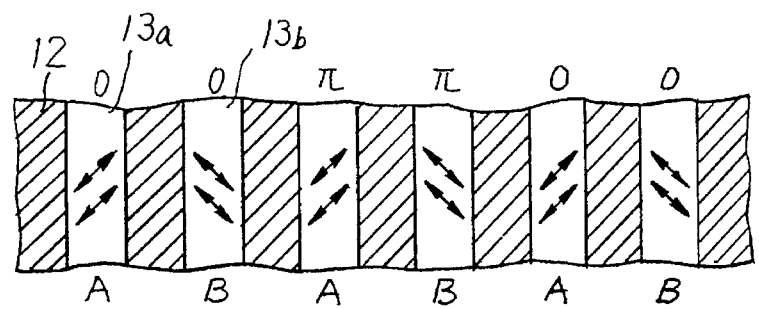
FIGS. 7a and 7b are schematic diagrams respectively showing the manner of arrangement of the pattern in the photo mask according to the fourth embodiment as looked from just above, and an amplitude-transmittance distribution of this photo mask.
Figure 7B:
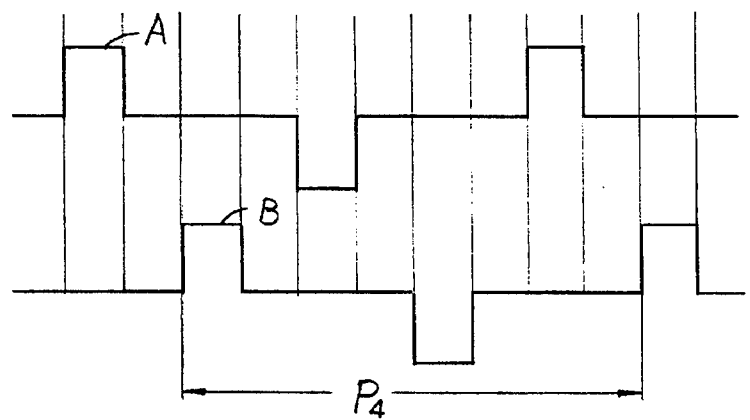

FIG. 6 shows schematically the cross-sectional construction of the photo mask according to the fourth embodiment, FIG. 7a shows schematically its planar construction, and FIG. 7b shows an amplitude-transmittance distribution of the photo mask according to the fourth embodiment.

As shown in FIGS. 6 and 7a, formed on a transparent substrate 11 is a line-and-space pattern in which a plurality of light shielding portions 12 made of chromium or the like are arranged at a given pitch $P_4$, and arranged alternately on light transmitting portions 14 adjoining the light shielding portions 12 are two kinds of polarizing members 13a and 13b which respectively transmit two kinds of linearly-polarized beams A and B whose directions of vibration are perpendicular to each other and are also inclined in the mutually opposite directions at an angle of 45 degrees relative to the lines of the pattern. This basic construction is practically the same as that of the previously mentioned third embodiment. Then, in this fourth embodiment every two light transmitting portions 14 (one of these light transmitting portions is provided with the polarizing member 13a which transmits the polarized beam A and the other is provided with the polarizing member 13b which transmits the polarized beam B) adjoining each other through one of the light shielding portions 12 are formed into a group and every other group is provided with a phase shifter 15 for changing (reversing) the phase of the transmitted beam by π radians.

The photo mask constructed as described above has an amplitude-transmittance distribution as shown in FIG. 7b. To begin with, the polarized beam A can be transmitted through only those light transmitting portions provided with the polarizing members 13a and the other light transmitting portions provided with the polarizing members 13b serve as light blocking portions for the polarized beam A. Also, with the light transmitting portions provided with the polarizing members 13a, every most adjacent two are reversed in amplitude relative to each other by one of the phase shifters 15. As regards the polarized beam B, the light transmitting portions provided with the polarizing members 13a to permit the transmission of the polarized beam A serve as light blocking portions and, as in the case of the polarized beam A, every most adjacent two of the light transmitting portions provided with the polarizing members 13b are reversed in amplitude relative to each other by one of the phase shifters 15.

Figure 10A:
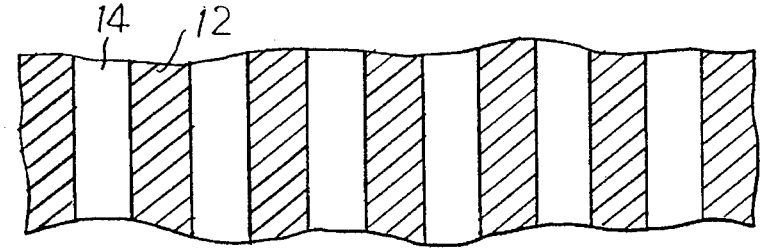
FIGS. 10a and 10b are schematic diagrams respectively showing the manner of arrangement of the pattern in the conventional photo mask as looked from just above and an amplitude-transmittance distribution of this photo mask.
Figure 10B:
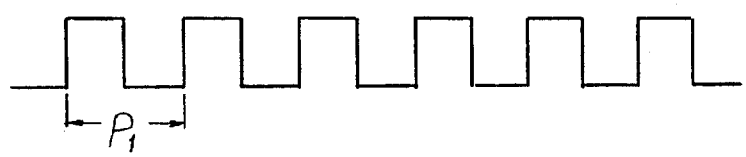
Figure 11:
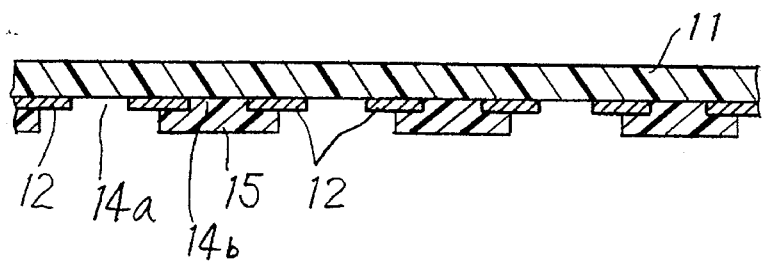
FIG. 11 is a schematic diagram showing the cross-sectional construction of a conventional phase-shifted mask.

As a result, the fundamental period $P_4$ of the pattern in FIG. 7a is established by the light transmitting portion provided with the polarizing member 13b (without the phase shifter 15), the light shielding portion 12, the light transmitting portion provided with the polarizing member 13b (with the phase shifter 15), the light shielding portion 12, the light transmitting portion provided with the polarizing member 13a (without the phase shifter 15) and the light shielding portion 12, and the fundamental period of the pattern becomes four times as compared with the conventional photo mask of FIG. 10a. Therefore, even if the same exposure apparatus is used, the use of the photo mask shown in FIGS. 6 and 7a makes it possible to resolve even much finer patterns as compared with the photo mask of FIG. 10a.

While it is needless to say that the method of combining the phase shifters and the polarizing members is not limited to the case of FIGS. 6 and 7, light beams whose directions of vibration are perpendicular to each other do not interfere with each other and therefore it is desirable to arrange the phase shifters and the polarizing members. In FIG. 7a, the polarized beams A and B do not interfere with each other but interference is produced between the polarized beams A as well as between the polarized beams B, with the result that if the phase shifter is added to only the light transmitting portions provided with the polarizing members 13a or 13b, the light beams which vibrate in the same direction are not changed in phase and it is all the same if the phase shifter is added or not.

Also, where polarizing members for transmitting a polarized beam C which vibrates in a third direction are provided in addition to the polarizing members for transmitting the two intersecting polarized beams A and B, the polarized beam A or B interfere partially with the polarized beam C and thus it is desirable to give consideration to the interference of the respective polarized beams with one another in cases where the three or more polarizing members are provided on the adjoining light transmitting portions.

As regards the phase-shifted mask, there have been proposed various types of phase-shifted masks including among others a spatial frequency modulation type in which a phase shifter is added to one of every pair of light transmitting portions which are adjacent to the sides of each light shielding portion (the photo mask described with reference to FIGS. 12a and 12b and the photo mask disclosed in Japanese Patent Publication No. 62-50811), a multiple-stage type employing phase shifters of different thicknesses, an auxiliary pattern type in which an auxiliary pattern composed of phase shifters is provided at the peripheral edge of a light shielding pattern, and an edge emphasizing type in which a phase shifter is provided at every boundary between a light shielding portion and a light transmitting portion, and the present invention is applicable to the phase-shifted mask of any type. In addition to the addition of phase shifters in combination with polarizing members as in the case of FIG. 7a, it is possible to arrange so that depending on the circuit pattern, only phase shifters are added in some areas and only polarizing members are added in other areas. Further, it is not always necessary to provided light shielding films at locations corresponding to the dark portions of a pattern image to be transferred and the pattern may be formed with phase shifters alone. For instance, by arranging phase shifters in a checkered pattern, it is possible to provide the dark portions in a pattern image without using any light shielding films.

While the embodiments described respectively with reference to FIGS. 5a and 5b and FIGS. 7a and 7b are directed to the case employing the polarizing members for converting the exposure light to two different linearly-polarized beams whose directions of vibration are perpendicular to each other, in accordance with the present invention the polarizing members may be of such type which produce circularly-polarized beams or elliptically-polarized beams whose directions of vibration rotate with time. Where the circularly-polarized beams are used, it is only necessary to arrange so that in the case of FIGS. 5a or 7a, a polarizing member for transmitting a circularly-polarized beam of clockwise rotation is added to one of every pair of light transmitting portions which are adjacent to the sides of each light shielding portion and a polarizing member for transmitting a circularly-polarized beam of counterclockwise rotation is added to the other light transmitting portions. Where the elliptically-polarized beams are utilized, the polarizing members added to every pair of light transmitting portions may be composed of two kinds of polarizing members for transmitting two different types of elliptically-polarized beams whose directions of the major axes are perpendicular to each other and which are opposite in the direction of rotation to each other.

Further, while the foregoing description is directed to the transmission-type photo masks, in the case of the reflection-type photo mask in which the reflecting members (reflecting films) are provided on the transparent substrate, polarizing members can be added to the reflecting portions so as to enhance the resolving power as in the case of the transmission-type photo mask. The reflection-type photo mask is such that the photo mask is subjected to falling radiation illumination and the reflected beams from the reflecting films are condensed by the imaging optical system to form an image. Since the light transmitting portions correspond to the dark portions of the image and the reflecting portions correspond to the light portions of the image, it is only necessary to consider by replacing the light transmitting portions with the reflecting portions and the light shielding portions with the light transmitting portions in the previously mentioned transmission-type photo mask.

What is claimed is:

1. A photo mask comprising:

a transparent substrate containing a pattern to be transferred and defining at least two side edges elongated respectively in a first direction and a second direction different from said first direction, said transparent substrate including a plurality of light transmitting portions adjacent to said side edges; and a plurality of polarizing members arranged on each of said light transmitting portions, said polarizing members being adapted to selectively transmit light beams each having electric vectors adapted to vibrate in a direction parallel to each of said side edges of said pattern.

2. A photo mask according to claim 1, and further comprising a phase shifter member, covering at least one of said light transmitting portions, for changing a phase of a transmitted beam.

3. A photo mask comprising:

a transparent substrate containing a pattern to be transferred and including a plurality of light transmitting portions; and a plurality of polarizing members arranged on each of said light transmitting portions of said transparent substrate;

wherein said polarizing members include a plurality of first polarizing elements each adapted to convert a transmitted beam into a beam in a first polarized light condition, and a plurality of second polarizing elements each adapted to convert a transmitted beam into a beam in a second polarized light condition different from said first polarized light condition.

4. A photo mask according to claim 3, and further comprising a plurality of phase shifter members for changing the phase of transmitted beams, which are provided for a part of said light transmitting portions provided with said polarizing members.

5. A photo mask according to claim 3, wherein the beams transmitted through adjoining ones of the first polarizing elements and the second polarizing elements are converted into polarized light conditions which are perpendicular to each other.

6. A photo mask according to claim 5, and further comprising a phase shifter member, covering at least one of said light transmitting portions, for changing a phase of a transmitted beam.

7. A photo mask according to claim 3, wherein each of said first polarizing elements converts a transmitted beam into a first linearly-polarized beam which vibrates in a first direction, and wherein each of said second polarizing elements converts a transmitted beam to a second linearly-polarized beam which vibrates in a second direction perpendicular to said first direction.

8. A photo mask according to claim 7, and further comprising a phase shifter member, covering at least one of said light transmitting portions, for changing a phase of a transmitted beam.

9. A photo mask according to claim 3, wherein each of said first polarizing elements converts a transmitted beam into a first circularly-polarized beam having a predetermined rotational direction, and wherein each of said second polarizing elements converts a transmitted beam into a second circularly-polarized beam having a rotational direction reverse relative to said predetermined rotational direction.

10. A photo mask according to claim 9, and further comprising a phase shifter member, covering at least one of said light transmitting portions, for changing a phase of a transmitted beam.

11. A photo mask according to claim 3, wherein each of said first polarizing elements converts a transmitted beam into a first elliptically-polarized beam having a predetermined rotational direction, wherein each of said second polarizing elements converts a transmitted beam into a second elliptically-polarized beam having a predetermined rotational direction reverse relative to that of said first elliptically-polarized beam, and wherein major axes of said first and second elliptically-polarized beams are perpendicular to each other.

12. A photo mask according to claim 11, and further comprising a phase shifter member, covering at least one of said light transmitting portions, for changing a phase of a transmitted beam.

13. A photo mask according to claim 3, and further comprising a phase shifter member, covering at least one of said light transmitting portions, for changing a phase of a transmitted beam.

* * * * *